United States Patent
Collins et al.

(10) Patent No.: US 7,045,269 B2
(45) Date of Patent: May 16, 2006

(54) METHOD FOR FORMING IMAGES USING NEGATIVE WORKING IMAGEABLE ELEMENTS

(75) Inventors: Jeffrey Collins, Greeley, CO (US); Thomas Jordan, Windsor, CO (US); Joanne Ray, Fort Collins, CO (US); Ting Tao, Fort Collins, CO (US); Chris McCullough, Fort Collins, CO (US); Scott A. Beckley, Windsor, CO (US); Jianbing Huang, Trumbull, CO (US)

(73) Assignee: Eastman Kodak Company, Rochester, NY (US)

( * ) Notice: Subject to any disclaimer, the term of this patent is extended or adjusted under 35 U.S.C. 154(b) by 67 days.

(21) Appl. No.: 10/718,953

(22) Filed: Nov. 21, 2003

(65) Prior Publication Data

US 2004/0180291 A1      Sep. 16, 2004

Related U.S. Application Data

(63) Continuation-in-part of application No. 10/384,989, filed on Mar. 10, 2003.

(51) Int. Cl.
*G03F 7/38* (2006.01)
*G03F 7/20* (2006.01)
*G03F 7/30* (2006.01)

(52) U.S. Cl. .................. 430/270.1; 430/325; 430/326; 430/281.1; 430/286.1; 430/287.1; 430/288.1; 430/302; 430/309; 430/434; 430/435; 430/494

(58) Field of Classification Search ............. 430/270.1, 430/281.1, 286.1, 287.1, 288.1, 302, 309, 430/434, 435, 494
See application file for complete search history.

(56) References Cited

U.S. PATENT DOCUMENTS

| | | | |
|---|---|---|---|
| 4,708,925 A | 11/1987 | Newman | |
| 5,314,747 A | 5/1994 | Malhotra et al. | |
| 5,372,907 A | 12/1994 | Haley et al. | |
| 5,466,557 A | 11/1995 | Haley et al. | |
| 5,543,262 A | 8/1996 | Sypek et al. | |
| 5,700,619 A | 12/1997 | Baumann et al. | |
| 5,763,134 A | 6/1998 | Busman et al. | |
| 5,919,601 A | 7/1999 | Nguyen et al. | |
| 5,962,190 A * | 10/1999 | McKeever ............... 430/281.1 |
| 5,965,319 A * | 10/1999 | Kobayashi ............... 430/176 |
| 6,358,669 B1 | 3/2002 | Savariar-Hauck et al. | |
| 6,391,519 B1 | 5/2002 | Kunita | |
| 6,525,152 B1 | 2/2003 | Jarek | |
| 6,620,957 B1 | 9/2003 | Tomita et al. | |
| 6,723,495 B1 * | 4/2004 | Ray et al. ............... 430/176 |
| 6,803,167 B1 * | 10/2004 | Patel et al. ............... 430/166 |
| 6,806,020 B1 * | 10/2004 | Haley et al. ............... 430/175 |
| 6,821,583 B1 * | 11/2004 | Shouldice et al. ......... 428/32.1 |
| 2002/0051934 A1 | 5/2002 | Nakamura et al. | |
| 2003/0113655 A1 * | 6/2003 | Hayakawa et al. ......... 430/176 |
| 2003/0157429 A1 * | 8/2003 | Blum et al. ............... 430/270.1 |

FOREIGN PATENT DOCUMENTS

| | | |
|---|---|---|
| EP | 1164127 A1 | 12/2001 |
| EP | 1186407 A1 | 3/2002 |
| WO | WO 00/17711 | 3/2000 |
| WO | WO 03/019293 A1 * | 3/2003 |

OTHER PUBLICATIONS

Fryer et al, Study of Acid Diffusion in Resist Near the Glass Transition Temperature, Journal, 1999, pp. 3351-3355, vol. 17(6).

Arai et al, A Sensitive Positive Resist for 0.1-μm Electron-Beam Direct-Writing Lithography, Journal, 1997, pp. 625-628, vol. 10(4).

Thackeray et al, Following the Acid: Effect of Acid Surface Depletion on Phenolic Polymers, Journal, 1995, pp. 110-123, vol. 614.

Sakamizu et al, Proceedings of SPIE—The International Society for Optical Engineering, Journal, 1997, pp. 448-458, (Abstract).

* cited by examiner

*Primary Examiner*—Sin Lee

(57) ABSTRACT

A method for forming images useful as lithographic printing plate precursors is disclosed. An imageable element in which the imageable layer comprises an acid generator, a crosslinking agent, and a binder is imaged with ultraviolet radiation and developed with a solvent based developer. The acid generator is an iodonium, sulfonium, or diazonium salt in which the anion is an organic sulfate or thiosulfate anion. The binder comprises a copolymer that contains a reactive pendent group capable of undergoing acid crosslinking, in which the reactive pendent group is hydroxyl, carboxylic acid, sulfonamide, alkoxymethyl, or a mixture thereof. The method is especially suited for use with direct digital ultraviolet imaging devices. The resulting image is useful as a lithographic printing plate.

32 Claims, No Drawings

METHOD FOR FORMING IMAGES USING NEGATIVE WORKING IMAGEABLE ELEMENTS

CROSS-REFERENCE TO RELATED APPLICATIONS

This application is a continuation-in-part application of U.S. application Ser. No. 10/384,989, filed Mar. 10, 2003, the disclosure of which is incorporated herein by reference.

FIELD OF THE INVENTION

The invention relates to lithographic printing. In particular, this invention relates to negative working imageable elements that are useful as lithographic printing plate precursors.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically the ink is first transferred to an intermediate blanket, which in turn transfers the ink to the surface of the material upon which the image is to be reproduced.

Imageable elements useful as lithographic printing plate precursors typically, comprise an imageable layer applied over the hydrophilic surface of a substrate. The imageable layer includes one or more radiation-sensitive components, which may be dispersed in a suitable binder. Alternatively, the radiation-sensitive component can also be the binder material. If, after imaging, the imaged regions of the imageable layer are removed in the developing process revealing the underlying hydrophilic surface of the substrate, the precursor is positive-working. Conversely, if the unimaged regions are removed by the developing process, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

Imaging with ultraviolet and/or visible radiation is typically carried out through a mask, which has clear and opaque regions. Imaging takes place in the regions under the clear regions of the mask but does not occur in the regions under the opaque regions of the mask. If corrections are needed, a new mask must be made. This is a time-consuming process. In addition, the mask may change slightly in dimension due to changes in temperature and humidity. Thus, the same mask, when used at different times or in different environments, may give different results and could cause registration problems.

Direct digital imaging of imageable elements, which obviates the need for imaging through a mask, is becoming increasingly important in the printing industry. Negative-working, alkaline developable imageable elements that comprise compounds that form an acid on thermal imaging have been developed. Haley, U.S. Pat. No. 5,372,907, Nguyen, U.S. Pat. No. 5,919,601, Kobayashi, U.S. Pat. No. 5,965,319, and Busman, U.S. Pat. No. 5,763,134, for example, disclose such imageable elements. However, these systems are: (1) imaged with infrared radiation, and (2) developed in aqueous alkaline developers that typically have a pH of 12 or more.

Digital imaging with ultraviolet radiation has certain advantages over digital imaging with infrared radiation. Digital ultraviolet platesetters are potentially less expensive than digital infrared platesetters. And because ultraviolet imageable systems are potentially much faster that infrared sensitive systems, an ultraviolet platesetter should have greater throughput and require less energy per image than an infrared platesetter.

However, higher speed negative working imageable elements are desirable for use with digital ultraviolet platesetters. In addition, disposal of high pH developers without creating environmental problems can be difficult, and, because the developer absorbs carbon dioxide from the air, developer activity can change during use. Thus, a need exists for higher speed negative-working imageable elements that can be imaged with digital ultraviolet platesetters and do not need to be developed in high pH developers.

SUMMARY OF THE INVENTION

The invention is a method for forming an image. The method comprises the steps of:

a) imaging an imageable element with ultraviolet radiation, the imageable element comprising an imageable layer over a support, and forming an imaged imageable element comprising imaged and complementary unimaged regions in the imageable layer; and b) developing the imaged imageable element with a developer and removing the unimaged regions without removing the imaged regions;

in which:

the imageable layer comprises an acid generator, a crosslinking agent, and a binder;

the acid generator is an iodonium, sulfonium, or diazonium salt in which the anion is an organic sulfate anion or an organic thiosulfate anion;

the crosslinking agent comprises at least two acid-activatable reactive groups;

the binder comprises a polymer that contains a reactive pendent group capable of undergoing acid-catalyzed crosslinking with the crosslinking agent, in which the reactive pendent group is selected from the group consisting of hydroxyl, carboxylic acid, sulfonamide, alkoxymethyl, and mixtures thereof; and the developer is a solvent based developer.

Optionally, the imaged imageable element may be heated after step a) and before step b). A preferred group of acid generators are diazonium salts in which the anion is an organic sulfate anion or an organic thiosulfate anion. A preferred reactive pendent group is the alkoxymethyl group.

These imageable elements have sufficient speed to be used with digital ultraviolet platesetters. Imaging energies of about 20 mJ/cm$^2$ or less, about 10 mJ/cm$^2$ or less, and about 5 to about 6 mJ/cm$^2$, of ultraviolet radiation have been observed. In addition, the imaged imageable elements do not need to be developed in high pH developers.

DETAILED DESCRIPTION OF THE INVENTION

Unless the context indicates otherwise, in the specification and claims, the terms novolac, derivatized novolac, acid generator, diazonium salt, crosslinking agent, binder, resole resin, co-binder, colorant, coating solvent and similar terms also include mixtures of such materials. Unless otherwise specified, all percentages are percentages by weight.

Imageable Elements

The imageable element comprises an imageable layer, which comprises an imageable composition, over the surface of a substrate. The imageable composition is a negative working imageable composition comprising an acid generator, a crosslinking agent, and a binder. Other ingredients that are conventional ingredients of negative working imageable compositions may also be present.

Imageable Composition

Acid Generators

Acid generators are precursors that form a Brönsted acid when exposed to ultraviolet and/or visible radiation. Acid generators for use in this invention include iodonium, sulfonium, and diazonium salts in which the anion is an organic sulfate anion or an organic thiosulfate anion. Examples of these anions include methyl sulfate or thiosulfate, ethyl sulfate or thiosulfate, propyl sulfate or thiosulfate, butyl sulfate or thiosulfate, hexyl sulfate or thiosulfate, octyl sulfate or thiosulfate, decyl sulfate or thiosulfate, dodecyl sulfate and thiosulfate, tetradecyl sulfate or thiosulfate, hexadecyl sulfate or thiosulfate, octadecyl sulfate or thiosulfate, trifluoromethyl sulfate or thiosulfate, benzyl sulfate or thiosulfate, and pentafluorophenyl sulfate and thiosulfate. Typically, the organic group has one to twenty carbon atoms, more typically five to eighteen carbon atoms. Typical acid generators include, for example, diphenyl iodonium octyl sulfate, diphenyl iodonium octyl thiosulfate, triphenyl sulfonium octyl sulfate, triphenyl sulfonium octyl thiosulfate, and 4,4'-dicumyl iodonium p-tolyl sulfate. The organic sulfate anion is more preferred.

A preferred group of acid generators are diazonium salts, such as diphenylamine diazonium octyl sulfate and thiosulfate, such as, diphenylamine diazonium dodecyl sulfate and thiosulfate; 4-(N,N-dimethylamino)-2-chlorobenzenediazonium octyl sulfate and thiosulfate; 4-(N,N-dimethylamino)-2-chlorobenzenediazonium decyl sulfate and thiosulfate; and 4-(N,N-dimethylamino)-2-chlorobenzenediazonium hexadecyl sulfate and thiosulfate. A preferred diazonium cation is the 2-methoxy-4-(phenylamino)-benzenediazonium cation. A group of preferred acid generators salt of the 2-methoxy-4-(phenylamino)-benzenediazonium cation with organic sulfate anions in which the organic group has one to twenty carbon atoms, preferably five to eighteen carbon atoms, such as 2-methoxy-4-(phenylamino)-benzenediazonium pentyl sulfate; 2-methoxy-4-(phenylamino)-benzenediazonium hexyl sulfate; 2-methoxy-4-(phenylamino)-benzenediazonium heptyl sulfate; 2-methoxy-4-(phenylamino)-benzenediazonium octyl sulfate (MSOS); 2-methoxy-4-(phenylamino)-benzenediazonium nonyl sulfate; 2-methoxy-4-(phenylamino)-benzenediazonium decyl sulfate; 2-methoxy-4-(phenylamino)-benzenediazonium dodecyl sulfate; 2-methoxy-4-(phenylamino)-benzenediazonium tetradecyl sulfate; 2-methoxy-4-(phenylamino)-benzenediazonium hexadecyl sulfate (MSHDS); 2-methoxy-4-(phenylamino)-benzenediazonium octadecyl sulfate; 2-methoxy-4-(phenylamino)-benzenediazonium benzyl sulfate; and 2-methoxy-4-(phenylamino)-benzenediazonium vinyl benzyl sulfate.

These acid generators can be prepared by mixing an onium salt, such as an onium chloride, bromide, or bisulfate, containing the desired onium cation with a sodium or potassium salt containing the desired anion, i.e. the desired alkyl or aryl sulfate or thiosulfate, either in water or in an aqueous solvent including a hydrophilic solvent such as an alcohol, for example methanol, ethanol, or propylene glycol methyl ether, such as are disclosed in U.S. patent application Ser. No. 10/155,696, filed May 24, 2002, incorporated herein by reference.

Crosslinking Agents

Acid-activatable crosslinking agents may comprise at least two acid-activatable reactive groups, such as the hydroxymethyl group, the alkoxymethyl group, the epoxy group, and the vinyl ether group, bonded to an aromatic ring. Examples include methylol melamine resins, resole resins, epoxidized novolac resins, and urea resins. Other examples are amino resins having at least two alkoxymethyl groups (e.g. alkoxymethylated melamine resins, alkoxymethylated glycolurils and alkoxymethylated benzoguanamines). Phenol derivatives comprising at least two groups such as the hydroxymethyl group and/or the alkoxymethyl group provide good fastness in an image portion when an image is formed. Examples of phenol derivatives include resole resins. Resole resins include, for example, GP649D99 resole (Georgia Pacific) and BKS-5928 resole resin (Union Carbide).

Resole resins are obtained by reaction of phenolic compounds with aldehydes, but under different reaction conditions than those that produce novolac resins. A typical example of a resole resin useful with novolac resins is the resole resin prepared from bis-phenol A and formaldehyde.

Phenol derivatives having a hydroxymethyl group can be prepared by reaction of a phenol without a hydroxymethyl group and formaldehyde in the presence of a base catalyst. Preferably, the reaction temperature is 60° C. or less to prevent resinification or gelation of the phenol derivative. Phenol derivatives having an alkoxymethyl group can be prepared by acid catalyzed reaction of the phenol derivative having a hydroxymethyl group with an alcohol. Preferably, the reaction temperature is 100° C. or less to prevent resinification or gelation of the phenol derivative. These phenol derivatives, especially phenol derivatives having an alkoxymethyl group, have superior storage properties.

Binders

The acid activatable crosslinking agent used in the composition may depend on the binder. In general, the binder is a polymer, or mixture of polymers, capable of undergoing an acid-catalyzed condensation reaction with the crosslinking agent when the element is heated to 60–220° C. The reactive pendant groups selected from the group consisting of hydroxyl, carboxylic acid, sulfonamide, alkoxymethyl amide, and mixtures thereof.

Copolymers that contain a reactive pendent group capable of undergoing acid crosslinking, in which the reactive pendent group is hydroxyl, carboxylic acid, sulfonamide, or alkoxymethyl, are disclosed in Nguyen, U.S. Pat. No. 5,919, 601, incorporated herein by reference. Typical copolymers include, for example, poly(4-hydroxystyrene/methyl methacrylate), poly(2-hydroxyethyl methacrylate/cyclohexyl methacrylate), poly(2-hydroxyethyl methacrylate/methyl methacrylate), poly(styrene/butyl methacrylate/methyl methacrylate/methacrylic acid), poly(butyl methacrylate/methacrylic acid), poly(vinylphenol/2-hydroxyethyl methacrylate), poly(styrene/n-butyl methacrylate/2-hydroxyethyl methacrylate/methacrylic acid), poly(styrene/ethyl methacrylate/2-hydroxyethyl methacrylate/methacrylic acid, and poly(2-hydroxyethyl methacrylate/cyclohexyl methacrylate/methacrylic acid).

A preferred reactive pendent group is the alkoxymethyl group, especially alkoxymethyl groups in which the alkoxy group has one to four carbon atoms. Copolymers that comprise, in polymerized form, an alkoxymethyl amide monomer, especially an alkoxymethyl amide monomer in which the alkoxy group contains one to four carbons atoms, such as N-methoxymethyl methacrylamide, N-ethoxymethyl methacrylamide, N-n-propoxymethyl methacrylamide, N-iso-propoxymethyl methacrylamide, N-n-butoxymethyl methacrylamide, N-sec-butoxymethyl methacrylamide N-tert-butoxymethyl methacrylamide, or N-iso-butoxymethyl methacrylamide are particularly useful. Examples are: poly(N-methoxymethyl methacrylamide/2-phenylethyl methacrylate/methacrylic acid); poly(N-methoxymethyl methacrylamide/2-phenylethyl methacrylate/methacrylamide/methacrylic acid); poly(N-methoxymethyl methacrylamide/styrene/butyl methacrylate/methacrylic acid); poly(N-iso-butoxymethyl acrylamide/2-hydroxyethyl methacrylate/methyl methacrylate); poly(methoxymethyl acrylamide/2-hydroxyethyl methacrylate/methyl methacrylate); poly(styrene/n-butyl methacrylate/methacrylic acid/N-iso-butoxymethyl methacrylamide); poly(styrene/n-butyl methacrylate/methacrylic acid/N-ethoxymethyl methacrylamide); poly(styrene/n-butyl methacrylate/methacrylic acid/N-methoxymethyl methacrylamide); poly(styrene/n-butyl methacrylate/methacrylic acid/N-n-butoxymethyl methacrylamide); poly(methacrylic acid/styrene/N-n-butoxymethyl methacrylamide); poly(methacrylic acid/styrene/N-methoxymethyl methacrylamide); poly(methacrylic acid/styrene/N-ethoxymethyl methacrylamide); poly(methacrylic acid/4-methylstyrene/N-n-butoxymethyl methacrylamide); poly(methacrylic acid/4-methylstyrene/N-ethoxymethyl methacrylamide); poly(methacrylic acid/4-methylstyrene/N-n-methoxymethyl methacrylamide); poly(methacrylic acid/styrene/N-methoxymethyl methacrylamide); poly(methacrylic acid/benzyl methacrylate/N-n-propoxymethyl methacrylamide); poly(methacrylic acid/benzyl methacrylate/N-methoxymethyl methacrylamide); poly(methacrylic acid/benzyl methacrylate/N-ethoxymethyl methacrylamide); poly(methacrylic acid/benzyl methacrylate/N-n-propoxymethyl methacrylamide); poly(methacrylic acid/benzyl methacrylate/N-i-propoxymethyl methacrylamide); poly(methacrylic acid/benzyl methacrylate/N-n-butoxymethyl methacrylamide); poly(methacrylic acid/benzyl methacrylate/N-i-butoxymethyl methacrylamide); poly(methacrylic acid/2-phenylethyl methacrylate/N-i-butoxymethyl methacrylamide); poly(methacrylic acid/2-phenyl ethyl methacrylate/N-methoxymethyl methacrylamide); poly(methacrylic acid/n-butyl methacrylate/N-i-butoxymethyl methacrylamide); and poly(methacrylic acid/n-butyl methacrylate/N-methoxymethyl methacrylamide).

The binders can be prepared by methods, such as free radical polymerization, which are well known to those skilled in the art and which are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Chain transfer agents, such as dodecyl mercaptan, may be used to control the molecular weight of the binder. Suitable solvents include liquids that are inert to the reactants and which will not otherwise adversely affect the reaction. Typical solvents include, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof. Methods for the preparation of thee binders are disclosed in, for example, Examples 18 and 19 of Nguyen, U.S. Pat. No. 5,919,601, incorporated herein by reference.

In addition, the imageable composition may comprise an additional binder or co-binder, typically a novolac resin, a novolac resin derivitized with a polar group, or a mixture thereof. Novolac resins are well known to those skilled in the art. They are typically prepared by condensation of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. A useful novolac resin for use in this invention is the resin prepared from m-cresol and formaldehyde.

A portion of the hydroxyl groups of a novolac resin can be derivatized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates). Derivitized novolac resins may be prepared by reaction of a novolac resin with an appropriate acid chloride, such as acetyl chloride, benzoyl chloride, 10-camphor sulfonyl chloride, phenyl sulfonyl chloride, methyl sulfonyl chloride, 2-nitrobenzene sulfonyl chloride, etc., in the presence of a base such as a tertiary amine, for example, triethyl amine, 4-methylmorpholine, or diazabicyclooctane. Although the degree of derivitization required will depend on the novolac and the nature of the polar groups introduced, typically about 0.5 mol % to about 5 mol %, preferably about 1 mol % to about 3 mol %, of the hydroxyl groups will be derivatized.

Other Ingredients

The imageable composition may also comprise other ingredients such as colorants (dyes and pigments) and surfactants that are conventional ingredients of imageable compositions. Surfactants may be present in the imageable composition as, for example, coating aids. A colorant, typically a dye, may be present to aid in the visual inspection of the imaged and/or developed element. Printout dyes distinguish the imaged regions from the unimaged regions during processing. Contrast dyes distinguish the unimaged regions from the imaged regions in the developed imageable element. Preferably the dye does not absorb the imaging radiation. Triarylmethane dyes, such as ethyl violet, crystal violet, malachite green, brilliant green, Victoria blue B, Victoria blue R, Victoria pure blue BO, and D11 (PCAS, Longjumeau, France), may act as a contrast dye.

Composition of the Imageable Layer

The imageable layer typically consists of a layer of the imageable composition. The imageable composition typically comprises about 0.01 to 50% by weight, preferably about 0.1 to 25% by weight, and more preferably about 0.5 to 20% by weight of the acid generator, based on the total weight of the layer. The imageable composition typically comprises about 5 to 70% by weight, and preferably about 10 to 65% by weight of the crosslinking agent based on the total weight of the layer. The imageable composition typically comprises about 10 to 90% by weight, preferably about 20 to 85% by weight, and more preferably about 30 to 80% by weight of the binder and, if present, co-binder or co-binders, based on the total weight of the layer.

For imageable elements that can be developed in solvent based developers, the total amount of novolac and derivatized novolac together should not exceed about 10 wt % of the imageable composition. When present, the total amount of novolac and derivatized novolac together typically comprise about 0.5 wt % to about 10 wt %, more typically about 2 wt % to about 6 wt % of the imageable composition. However, greater amounts of novolac and/or derivatized novolac may be used in the imageable composition, but high pH developers must be used to develop the resulting imaged imageable elements.

When present, the contrast dye is typically about 0.1 wt % to about 10 wt %, more typically 0.5 wt % to 5 wt %, of the imageable composition.

Substrate

The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of the imageable layer. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 μm to about 600 μm. Typically, the substrate comprises an interlayer between the aluminum support and the imageable layer. The interlayer may be formed by treatment of the support with, for example, silicate, dextrine, hexafluorosilicic acid, phosphate/fluoride, polyvinyl phosphonic acid or vinyl phosphonic acid copolymers.

The back side of the substrate (i.e., the side opposite the imageable layer) may be coated with an antistatic agent and/or a slipping layer or matte layer to improve handling and "feel" of the imageable element.

Preparation of the Imageable Element

The imageable element may be prepared by applying the imageable layer over the hydrophilic surface of the substrate using conventional techniques. Typically, the imageable layer has a coating weight of about 0.5 to about 4 $g/m^2$, preferably 0.8 to 3 $g/m^2$.

Typically the ingredients are dispersed or dissolved in a suitable coating solvent, and the resulting mixture coated by conventional methods, such as spin coating, bar coating, gravure coating, die coating, or roller coating. The coating solvent should be a solvent in which the components of the imageable composition are sufficiently soluble that the imageable layer can be formed. Following coating, the resulting donor element may be dried to remove the coating solvent. The element may be dried by, for example, air drying or drying in an oven, for example at about 80° C. to 90° C. for 1 minute to 5 minutes.

Alternatively, the imageable layer may be applied by conventional extrusion coating methods from a melt mixture of layer components. Typically, such a melt mixture contains no volatile organic solvents.

Imaging and Processing

The imageable element may be imaged using ultraviolet radiation, typically from about 300 nm to 450 nm. Conventional ultraviolet sources include, for example, carbon arc lamps, mercury vapor lamps, xenon lamps, mercury xenon lamps, tungsten lamps, and metal halide lamps. Imaging with these light sources is typically carried out by exposure through a mask, using a lightframe such as the Olix A1 131 ultraviolet lightframe (OLEC, Irvine, Calif., USA).

Direct digital imaging, which obviates the need for exposure through a mask, may be carried out with a laser emitting in the ultraviolet, such as a xenon, argon ion, or ionized neon laser, a tunable dye laser, or a frequency doubled neodymium: YAG laser. Platesetters that provide direct digital ultraviolet imaging include the Metro Ultraviolet Computer to Plate System (PerkinElmer Optoelectronics, Azusa, Calif., USA), which is reported to use an argon ion laser emitting in the range of 351 to 364 nm; the Metro ST Ultraviolet Computer to Plate Systems (PerkinElmer Optoelectronics, Azusa, Calif., USA), which are reported to use diode pumped solid state lasers emitting in the range of 355 nm; the FasTRAK CTP/C Imagesetter (alphaQuest Technologies, Rolling Meadows, Ill., USA), which is reported to use an ultraviolet laser emitting at about 355 nm); and the BasysPrint ultraviolet platesetter, which uses a collimated ultraviolet light source rather than an ultraviolet laser (BasysPrint, Boizenburg, Germany).

After imaging, the imaged element may be heated. This optional heating step can be carried out by radiation, convection, contact with heated surfaces, for example, with rollers, or by immersion in a heated bath comprising an inert liquid, for example, water. Preferably, the imaged imageable element is heated in an oven.

The heating temperature is typically determined by the fog point of the imageable element. The fog point is defined as the lowest temperature, at a heating time of two minutes, required to render a thermally imageable element non-processable (i.e., no image is formed on development). When the imaged imageable element is heated above the fog point, the unimaged regions crosslink. Because they are not removed by developer, no image is formed. Preferably, the temperature is about 28° C. or less below the fog point at a heating time of two minutes, more preferably about 17° C.

or less below the fog point at a heating time of two minutes and most preferably about 8° C. below the fog point. Typically, the heating temperature is about 110° C. to 150° C. The heating time can vary widely, depending on the method chosen for the application of heat as well as the other steps in the process. If a heat-transferring medium is used, the heating time will preferably be from about 30 seconds to about 30 minutes, more preferably from about 1 minute to about 5 minutes. When the imaged imageable element is heated in an oven, the heating time is preferably from about 1 minute to about 5 minutes.

Imaging produces an imaged element, which comprises a latent image of imaged and unimaged regions. Development of the imaged element to form an image converts the latent image to an image by removing the unimaged regions, but not the complementary imaged regions, revealing the hydrophilic surface of the underlying substrate in the unimaged regions.

The imageable elements of the invention can be efficiently developed with solvent based developers so that the use of high pH developers, which present a disposal problem and can absorb carbon dioxide from the air during use causing deterioration of the developer, is not necessary. Solvent based developers typically have a pH below 10.5. Solvent based developers comprise an organic solvent or a mixture of organic solvents and are typically silicate free. Because the developer is a single phase, the organic solvent or mixture of organic solvents must be either miscible with water or sufficiently soluble in the developer that phase separation does not occur. Suitable organic solvents include: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms; ethers of ethylene glycol, diethylene glycol, and of propylene glycol with alkyl groups having six or fewer carbon atoms, such as 2-ethoxyethanol and 2-butoxyethanol; and mixtures thereof. The organic solvent is typically present in the developer at a concentration of between about 0.5 wt % to about 15 wt %, based on the weight of the developer, preferably between about 3 wt % and about 5 wt %, based on the weight of the developer. Typical commercially available solvent based developers include 956 Developer, 955 Developer and SP200, each available from Kodak Polychrome Graphics, Norwalk, Conn., USA.

The developer is typically applied to the imaged precursor by spraying the element with sufficient force to remove the unimaged regions but not the imaged regions. Alternatively, development may carried out in a processor equipped with an immersion-type developing bath, a section for rinsing with water, a gumming section, a drying section, and a conductivity-measuring unit, or the imaged precursor may be brushed with the developer. In each instance, a printing plate is produced. Development may conveniently be carried out in a commercially available spray-on processor, such as an 85 NS (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinylalcohol, polymethacrylic acid, polymethacrylamide, polyhydroxyethylmethacrylate, polyvinylmethylether, gelatin, and polysaccharide such as dextrin, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of 120° C. for 30 min.

INDUSTRIAL APPLICABILITY

The imageable elements of the invention are useful as lithographic printing plate precursors. They typically have photospeeds of about 5 mJ/cm$^2$ to about 20 mJ/cm$^2$, in some cases about 5 mJ/cm$^2$ to about 10 mJ/cm$^2$, and about 5 mJ/cm$^2$ to about 6 mJ/cm$^2$, of imaging energy (ultraviolet radiation) and, thus, can be imaged with digital ultraviolet platesetters. In addition, they can be developed in solvent based developers.

After the imageable element has been imaged and processed to form a printing plate, printing can be carried out by applying a fountain solution and then a lithographic ink to the image on its surface. Fountain solution is taken up by the surface of the substrate exposed by imaging and development, and the ink is taken up by the complementary regions. The ink is transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

GLOSSARY

956 Developer Solvent based (phenoxyethanol) alkaline negative developer (Kodak Polychrome Graphics, Norwalk, Conn., USA)

BasysPrint Platesetter UV platesetter using a collimated ultraviolet light source (BasysPrint, Boizenburg, Germany)

BYK 307 Surfactant; polyethoxylated dimethylpolysiloxane copolymer (Byk Chemie, Wallingford, Conn., USA)

BYK 333 Surfactant; polyether modified dimethylpolysiloxane copolymer (Byk Chemie, Wallingford, Conn., USA)

D11 Ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1); colorant dye (see structure below) (PCAS, Longjumeau, France)

DOWANOL® PM Propylene glycol methyl ether (1-methoxy-2-propanol) (Dow, Midland, Mich., USA)

FasTRAK CTP/C Imagesetter which uses an ultraviolet laser (355 nm) (alphaQuest Technologies, Rolling Meadows, Ill., USA)

Glunz & Jensen Interplater Processor (Glunz & Jensen, Denmark)

Metro Imagesetter Ultraviolet computer to plate systems, reported to use argon ion lasers emitting in the range of 351 to 364 nm (PerkinElmer Optoelectronics, Azusa, Calif.)

MSHDS 2-Methoxy-4-(phenylamino)-benzenediazonium hexadecyl sulfate

MSOS 2-Methoxy-4-(phenylamino)-benzenediazonium octyl sulfate

N-13 Novolac resin; 100% m-cresol; MW 13,000 (Eastman Kodak Rochester, N.Y., USA)

Resole resin GP649D99 (Georgia-Pacific, Decatur, Ga., USA)

RF-1216 Tosylated novolac resin SPC 48/127 Oven Wisconsin Oven, East Troy, Wis., USA Substrate A 0.3 mm (0.3 gauge), aluminum sheet, electrograined, anodized, and post treated with a solution of polyvinyl phosphonic acid T-95 Binder Copolymer containing 9.2 mol % methacrylic acid, 34.8 mol % benzyl methacrylate, and 56.0 mol % N-methoxymethyl methacrylamide

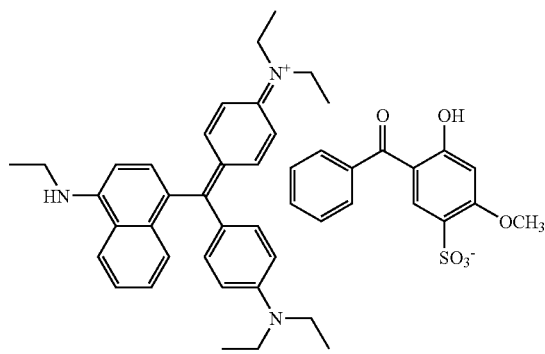

D11

Evaluation Procedures

Fog Point Determination The imageable element was cut into about 12 cm×68 cm (5"×27") pieces, and the pieces were sent through a SPC 48/127 Oven at various temperatures until the temperature at which first fog was determined. The first fog point was determined by visual observation of minor coating retention in the background area following development. This was confirmed by determining the clear out temperature at which no coating was retained on development. After the fog temperature had been determined, the preheat set point was set to 11° C. (20° F.) below the fog point.

Chemical Resistance Test A. Drops of PRISCO® Liquid Plate Cleaner (Prisco, Newark, N.J., USA) were placed on a solid imaged area of an imaged imageable element. After 2 minutes the plate cleaner was rinsed off under water and the imaged elements were allowed to air-dry. The dried elements were visually inspected for resistance against attack by the plate cleaner and given a rating of no resistance (NR), partial resistance (PR), or total resistance (TR).

Test B. The procedure was repeated using an 80% 1-butoxyethano/20% water for a period of 1 minute.

Example 1

This example illustrates preparation and evaluation of an imageable element of the invention.

A coating solution containing the components listed in Table 1 in DOWANOL® PM/butyrolactone/water (80/10/10) (5.68% total solids) were coated onto substrate A using a slot coater. The resulting element was dried at 88° C. for about 2 minutes. The dry coating weight of the imageable layer was 1.4 g/m$^2$. The fog point was about 152° C. (306° F.).

TABLE 1

| Component | wt % of the Imageable Layer |
| --- | --- |
| Resole resin | 33.72 |
| T-95 Binder | 52.82 |
| MSOS | 11.88 |
| D11 | 1.15 |
| BYK 333 | 0.09 |
| BYK 307 | 0.34 |

The resulting imageable element was evaluated on a Metro Imagesetter using an internal test pattern. The imaging energies were 2.0, 3.9, 5.9, 7.9 and 9.8 mJ/cm$^2$. Following imaging, the imaged element was preheated in a SPC 48/127 Oven at about 11° C. (20° F.) below the fog point. Following preheating, the imaged element was developed in a Glunz & Jensen Interplater processor containing 956 developer. The imageable element had a speed range of 5.9 to 9.8 mJ/cm$^2$. Dot density for the 50% dot was determined as a function of imaging energy using an X-RITE® Model 418 Densitometer (X-Rite of Grandville, Mich., USA) using the cyan filter. These values are shown in Table 2.

TABLE 2

| Imaging energy (mJ/cm$^2$) | 50% Dot Measurement |
| --- | --- |
| 5.9 | 48% |
| 7.9 | 55% |
| 9.8 | 57% |

The imageable element was imaged with an internal test pattern using a FasTRAK CTP/C image setter. The imaging energies were 5, 10, 15, 20, 25 and 30 mJ/cm$^2$. Following imaging, the imaged element was preheated and developed as above. The imageable element was found to have a speed of no more than 5 mJ/cm$^2$.

Dot density for the 50% dot was determined using a X-RITE Model 418 Densitometer using the cyan filter. At an imaging energy of 5.0 mJ/cm$^2$, the 50% dot had a dot density of 51%.

Chemical resistance for the imaged imageable element is shown in Table 3.

TABLE 3

| Imaging energy (mJ/cm$^2$) | Test A | Test B |
| --- | --- | --- |
| 5 | NR | PR |
| 10 | PR | TR |

The imageable element was imaged on the BasysPrint platesetter as described in Example 2, and then preheated and developed as above. The imageable element was overexposed at the lowest power setting, Setting 3.

Example 2

This example illustrates preparation and evaluation of an imageable element of the invention.

A coating solution containing the components listed in Table 4 in DOWANOL® PM/butyrolactone/water (92/4/4) (5.70% total solids) were coated onto substrate A using a slot coater. The resulting element was dried at 88° C. for about 2 minutes. The dried coating weight was 1.4 g/m². The fog point was about 152° C. (about 308° F.).

TABLE 4

| Component | wt % of the Imageable Layer |
|---|---|
| Resole resin | 34.49 |
| T-95 Binder | 48.64 |
| MSOS | 9.89 |
| D11 | 1.15 |
| BYK 333 | 0.08 |
| BYK 307 | 0.32 |
| RF1216 | 5.40 |

The resulting imageable element was evaluated on a BasysPrint UV Setter using an internal test pattern (360 to 450 nm). The platesetter comprises two imaging heads, left and right. The imageable element was imaged at three different power settings:

| Setting 1 | Left 17 units | Right 13 units |
| Setting 2 | Left 11 units | Right 8 units |
| Setting 3 | Left 7 units | Right 5 units |

Following imaging, the imaged element was preheated and developed as in Example 1.

The imageable element was over-exposed at the lowest power setting, Setting 3. Lower power settings could not be achieved with this imaging device.

Example 3

This example illustrates preparation and evaluation of an imageable element of the invention.

A coating solution containing the components listed in Table 5 in DOWANOL® PM/butyrolactone/water (92/4/4) (4.96% total solids) were coated onto substrate A using a slot coater. The resulting element comprising was dried at 88° C. for about 2 minutes. The dry coating weight of the imageable layer was 1.4 g/m². The fog point was about 152° C. (306° F.).

TABLE 5

| Component | wt % of the Imageable Layer |
|---|---|
| Resole resin | 33.07 |
| T-95 Binder | 51.8 |
| MSOS | 9.48 |
| D11 | 1.10 |
| BYK 333 | 0.08 |
| BYK 307 | 0.32 |
| N-13 | 4.14 |

The resulting imageable element was evaluated using a FasTRAK CTP/C imagesetter using an internal test pattern, pre-heated and developed as in Example 1. The imageable element had a speed of 10 mJ/cm².

Dot density for the 50% dot was determined using an X-RITE® Model 418 Densitometer using the cyan filter. At an imaging energy of 10.0 mJ/cm², the 50% dot had a dot density of 53%. Chemical resistance for the imageable element imaged at 10 mJ/cm² was NR for Test A and PR for test B.

Example 4

This example illustrates the synthesis of 2-methoxy-4-(phenylamino)-benzenediazonium octyl sulfate (MSOS).

64.0 g of 35% sodium octyl sulfate (Aldrich, Milwaukee, Wis., USA) in water was slowly added in 31.0 g of 2-methoxy-4-(phenylamino)-benzenediazonium bisulfate (Diverstec, Fort Collins, Colo., USA) in 500 ml of water with stirring. The resulting mixture was stored in the dark at 0–5° C. for 5 hours. After the water was decanted, the resulting oil was dissolved in 200 ml of ethyl acetate. The resulting solution was washed with 50 ml of 5% aqueous sodium bicarbonate and with 50 ml of water. The organic layer was dried over anhydrous magnesium sulfate for 6 hours and the solvent removed by vacuum. 35.1 g of oil was obtained.

Proton NMR (in acetone-$d_6$): δ 0.84 (3H, t), 1.22 (10H, m), 1.53 (2H, p), 3.88 (2H, t), 4.10 (3H, s), 6.50–7.60 (7H, m), 8.17 (1H, d), and 10.9 (1H, s).

Example 5

This example illustrates the synthesis of 2-methoxy-4-(phenylamino)-benzenediazonium hexadecyl sulfate) (MSHDS).

3.25 g of 2-methoxy-4-(phenylamino)-benzenediazonium bisulfate (Diversitec, Fort Collins, Colo.) in 50 ml of water was neutralized with 0.8 g of sodium bicarbonate in 25 ml water. 3.45 g of sodium hexadecyl sulfate (TCI America, Portland, Oreg., USA) was dissolved in 150 ml of water at 50° C. The solution of the diazonium salt as slowly added to the hexadecyl sulfate solution with stirring. The reaction mixture was stored in the dark at 0–5° C. for 12 hours. The resulting precipitate was filtered off and dried in vacuum. Yield: 5.4 g.

Proton NMR (in acetone-$d_6$): δ 0.87 (3H, t), 1.31 (26H, m), 1.58 (2H, m), 3.90 (2H, t), 4.15 (3H, s), 6.90–7.60 (7H, m), 8.19 (1H, d), and 11.10 (1H, s).

Example 6

This example describes the preparation of a tosylated novolac resin. By this procedure a novolac resin tosylated to 1.8 mol % is prepared from a m-cresol/formaldehyde novolac resin obtained from Schenectady International, Schenectady, N.Y., USA.

Dry novolac resin (120 g) is dissolved by stirring in acetone (325 g) in a 600 mL beaker and the solution cooled to about 10° C. p-Toluene sulfonyl chloride (3.56 g) is added over a period of about 1 min. Triethyl amine (2.09 g) is added at about 10° C. over a period of about 1 hr and the reaction mixture stirred at ≦15° C. for 1 hr. Acetic acid (1.36 g) is added at about 10° C. over about 1 min and the reaction mixture stirred for about 15 min.

A mixture of 3.0 Kg of ice and 3.0 Kg of water is placed in a 7.5 L breaker. Acetic acid (5 g) is added with stirring and the mixture stirred at about 15° C. for about 1 min. About 25% of the reaction mixture is added and the mixture stirred for about 20 min. The reaction mixture is allowed to settle for about 20 min and the supernatant decanted from the precipitate.

Water (about 1.9 Kg) is added to the precipitate and the resulting mixture stirred for 5 min at about 15° C. The precipitate is allowed to settle for 20 min and the supernatant decanted. The process is repeated with the remaining three portions of the reaction mixture. The precipitate is collected and dried to yield about 123 g of tosylated novolac resin in which about 1.8 mol % of the hydroxyl groups have been converted to tosyl groups.

Having described the invention, we now claim the following and their equivalents.

What is claimed is:

1. A method for forming an image, the method comprising the steps of:
   a) imaging an imageable element with ultraviolet radiation, the imageable element comprising an imageable layer over a support, and forming an imaged imageable element comprising imaged and complementary unimaged regions in the imageable layer; and
   b) developing the imaged imageable element with a developer and removing the unimaged regions without removing the imaged regions;
   in which:
   the imageable layer comprises an acid generator, a crosslinking agent, and a binder;
   the acid generator is an iodonium, sulfonium, or diazonium salt in which the anion is an organic sulfate anion or an organic thiosulfate anion;
   the crosslinking agent comprise at least two acid-activatable reactive groups;
   the binder comprises a polymer that contains a reactive pendent group capable of undergoing acid-catalyzed crosslinking with the crosslinking agent, in which the reactive pendent group is selected from the group consisting of hydroxyl, carboxylic acid, sulfonamide, alkoxymethyl, and mixtures thereof;
   the imageable layer additionally comprises a colorant;
   about 20 mJ/cm$^2$ or less of imaging energy is used in step a); and
   the developer is a solvent based developer.

2. The method of claim 1 in which imaging is direct digital imaging.

3. The method of claim 1 in which the reactive pendent group is an alkoxymethyl group.

4. The method of claim 3 in which the alkoxy group of the alkoxymethyl group has one to four carbon atoms.

5. The method of claim 4 in which the binder is a copolymer that comprises, in polymerized form, an alkoxymethyl amide monomer selected from the group consisting of N-methoxymethyl methacrylamide, N-ethoxymethyl methacrylamide, N-n-propoxymethyl methacrylamide, N-iso-propoxymethyl methacrylamide, N-n-butoxymethyl methacrylamide, N-sec-butoxymethyl methacrylamide N-tert-butoxymethyl methacrylamide, and N-iso-butoxymethyl methacrylamide.

6. The method of claim 4 in which the acid generator is a diazonium salt.

7. The method of claim 6 in which the anion of the diazonium salt is an organic sulfate anion.

8. The method of claim 7 in which the crosslinking agent is a resole resin.

9. The method of claim 8 in which the cation of the diazonium salt is a 2-methoxy-4-(phenylamino)-benzenediazonium cation.

10. The method of claim 1 in which the binder additionally comprises a novolac resin, novolac resin derivitized with a polar group, or a mixture thereof.

11. The method of claim 10 in which the acid generator is a diazonium salt.

12. The method of claim 11 in which the crosslinking agent is a resole resin.

13. The method of claim 12 in which:
   the acid generator is a diazonium salt anion in which the anion of the diazonium salt is an organic sulfate anion and the cation of the diazonium salt is a 2-methoxy-4-(phenylamino)-benzenediazonium cation; and
   the crosslinking agent is a resole resin.

14. The method of claim 1 additionally comprising, after step a) and before step b), the step of heating the imaged imageable element.

15. The method of claim 14 in which the reactive pendent group is an alkoxymethyl group in which the alkoxy group has one to four carbon atoms.

16. The method of claim 14 in which the crosslinking agent is a resole resin.

17. The method of claim 1 in which about 10 mJ/cm$^2$ or less of imaging energy is used in step a).

18. The method of claim 1 in which about 5 mJ/cm$^2$ to about 6 mJ/cm$^2$ of imaging energy is used in step a).

19. A method for forming an image, the method comprising the steps of:
   a) imaging an imageable element with ultraviolet radiation, the imageable element comprising an imageable layer over a support, and forming an imaged imageable element comprising imaged and complementary unimaged regions in the imageable layer; and
   b) developing the imaged imageable element with a developer and removing the unimaged regions without removing the imaged regions;
   in which:
   the imageable layer comprises an acid generator, a crosslinking agent, and a binder;
   the acid generator is an iodonium, sulfonium, or diazonium salt in which the anion is an organic sulfate anion or an organic thiosulfate anion;
   the crosslinking agent comprise at least two acid-activatable reactive groups;
   the binder comprises a polymer that contains a reactive pendent group capable of undergoing acid-catalyzed crosslinking with the crosslinking agent, in which the reactive pendent group is selected from the group consisting of hydroxyl, carboxylic acid, sulfonamide, alkoxymethyl, and mixtures thereof;
   about 20 mJ/cm$^2$ or less of imaging energy is used in step a); and
   the developer is a solvent based developer.

20. The method of claim 19 additionally comprising, after step a) and before step b), the step of heating the imaged imageable element.

21. The method of claim 20 in which the reactive pendent group is an alkoxymethyl group in which the alkoxy group has one to four carbon atoms.

22. The method of claim 21 in which the crosslinking agent is a resole resin.

23. The method of claim 22 in which the acid generator is a diazonium salt in which the anion of the diazonium salt is an organic sulfate anion and the cation of the diazonium salt is a 2-methoxy-4-(phenylamino)-benzenediazonium cation.

24. The method of claim 23 in which the binder is a copolymer that comprises, in polymerized form, an alkoxymethyl amide monomer selected from the group consisting of N-methoxymethyl methacrylamide, N-ethoxymethyl methacrylamide, N-n-propoxymethyl methacrylamide, N-iso-propoxymethyl methacrylamide, N-n-butoxymethyl methacrylamide, N-sec-butoxymethyl methacrylamide N-tert-butoxymethyl methacrylamide, and N-iso-butoxymethyl methacrylamide.

25. The method of claim 23 in which about 10 mJ/cm$^2$ or less of imaging energy is used in step a).

26. The method of claim 25 in which the binder additionally comprises a novolac resin, novolac resin derivitized with a polar group, or a mixture thereof.

27. The method of claim 26 in which the novolac resin and novolac resin derivitized with a polar group together comprise about 0.5 wt % to about 10 wt % of the imageable layer.

28. The method of claim 27 in which the reactive pendent group is an alkoxymethyl group in which the alkoxy group has one to four carbon atoms.

29. The method of claim 28 in which the crosslinking agent is a resole resin.

30. The method of claim 29 in which the acid generator is a diazonium salt and the anion of the diazonium salt is an organic sulfate anion.

31. The method of claim 30 in which the cation of the diazonium salt is a 2-methoxy-4-(phenylamino)-benzenediazonium cation.

32. The method of claim 31 in which about 5 mJ/cm$^2$ to about 6 mJ/cm$^2$ of imaging energy is used in step a).

* * * * *